(12) United States Patent
Tonotani et al.

(10) Patent No.: US 6,323,595 B1
(45) Date of Patent: Nov. 27, 2001

(54) HIGH FREQUENCY DISCHARGING METHOD AND APPARATUS, AND HIGH FREQUENCY PROCESSING APPARATUS

(75) Inventors: Junichi Tonotani, Yokohama; Keiji Suzuki, Kawasaki, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/652,161

(22) Filed: Aug. 31, 2000

Related U.S. Application Data

(63) Continuation of application No. 09/251,486, filed on Feb. 17, 1999, now Pat. No. 6,181,069.

(30) Foreign Application Priority Data

Feb. 17, 1998 (JP) .................................................. 10-034916
Jan. 14, 1999 (JP) .................................................. 11-007581

(51) Int. Cl.$^7$ ...................................................... H01J 7/24
(52) U.S. Cl. ................ 315/111.51; 315/111.21; 118/723 I
(58) Field of Search .................. 315/111.51–111.71, 315/111.21; 118/723 I, 723 IR; 204/298.08, 298.31, 298.38; 156/345

(56) References Cited

U.S. PATENT DOCUMENTS

| 5,036,252 | 7/1991 | Tomioka et al. ............ 315/111.51 X |
| 5,589,737 | 12/1996 | Barnes et al. ............... 315/111.51 X |
| 5,824,158 | 10/1998 | Takeuchi et al. ........... 315/111.51 X |
| 5,891,252 | * 1/2001 | Yokogawa et al. ......... 315/111.51 X |
| 5,891,349 | 4/1999 | Tobe et al. ..................... 118/723 I X |
| 5,897,713 | 4/1999 | Tomika et al. .............. 315/111.51 X |
| 6,181,069 | * 1/2001 | Tonotani et al. ................ 315/111.51 |

FOREIGN PATENT DOCUMENTS

| 7-18433 | 1/1995 | (JP) . |
| 8-81777 | 3/1996 | (JP) . |

* cited by examiner

*Primary Examiner*—Haissa Philogene
(74) *Attorney, Agent, or Firm*—Oblon, Spivak, McClelland, Maier & Neustadt, P.C.

(57) ABSTRACT

Arranging a linear antenna in a container, and connecting a condenser to a grounding side of the linear antenna, and/or between a plurality of linear antennas, and changing capacity of the condenser, thereby changing high-frequency voltage distribution on the linear antenna and/or on the plurality of linear antennas, and controlling electrostatic coupling between the plasma and the linear antenna and/or the plurality of linear antennas.

6 Claims, 12 Drawing Sheets

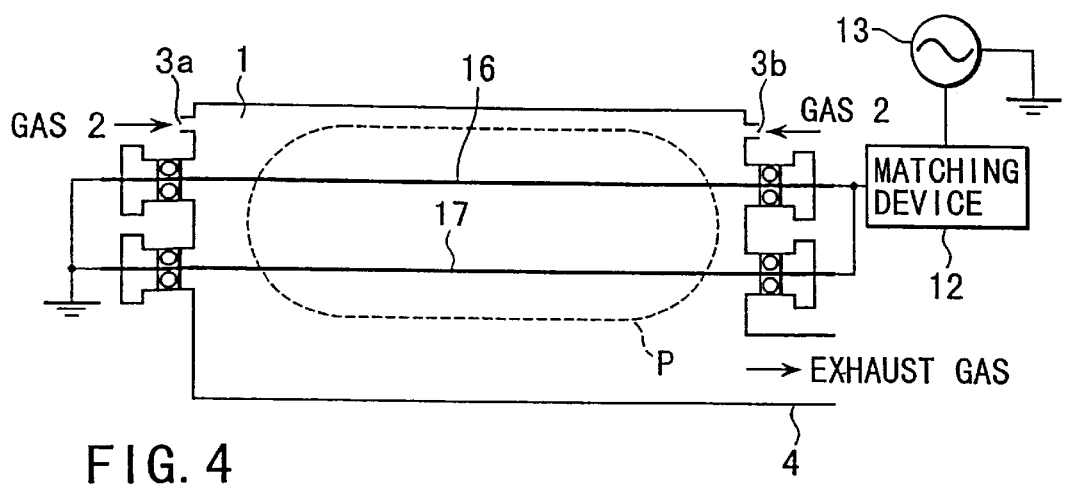
FIG. 4
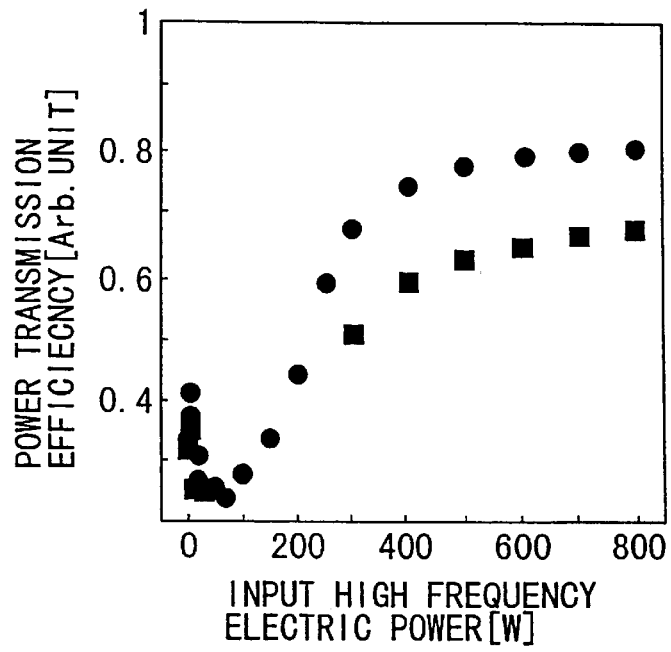
FIG. 5
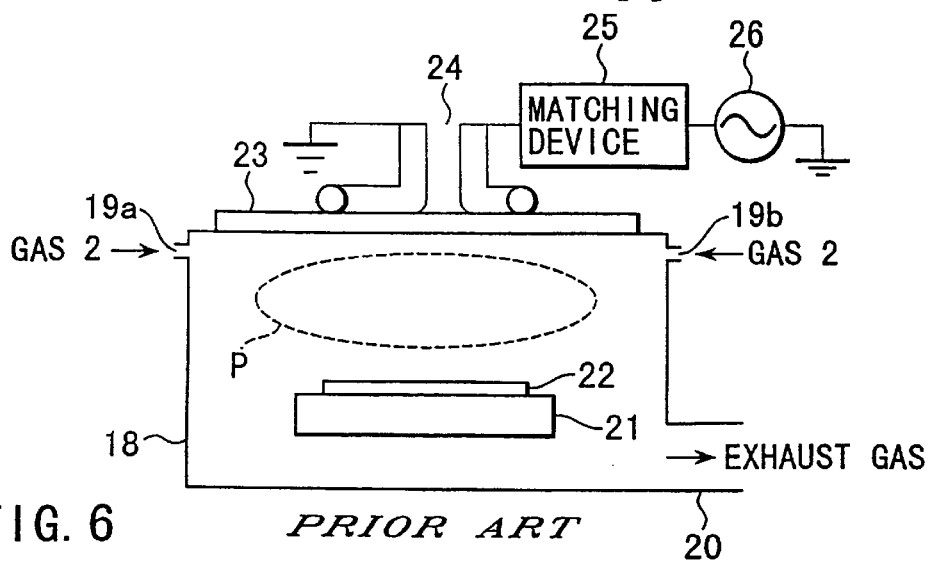
FIG. 6  *PRIOR ART*

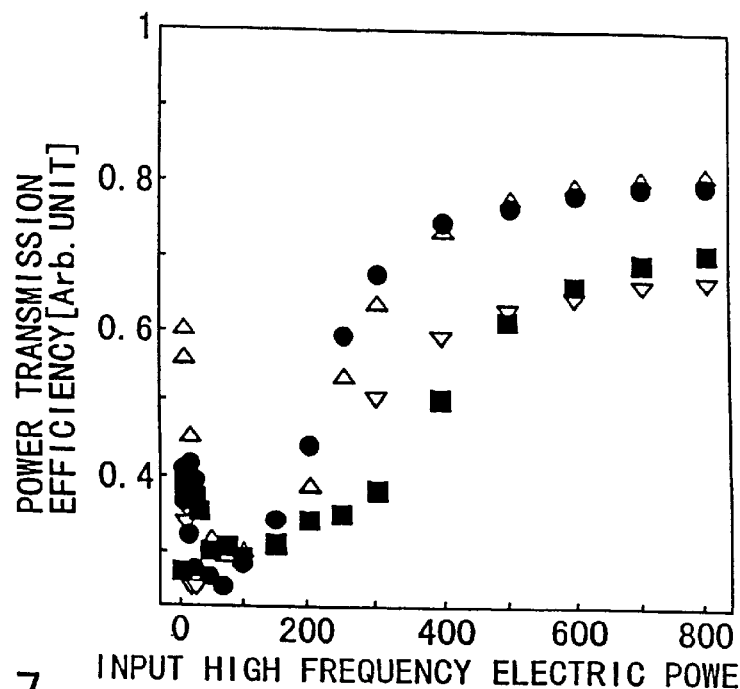
FIG. 7
| ANTENNA | SUBSTRATE | SURFACE ELEMENT COMPOSITION RATIO[%] | | | |
|---|---|---|---|---|---|
| | | Al | Cu | Si | C |
| BARE Al | POLY-Si | 36.2 | — | — | 12.9 |
| LINEAR Cu+QUARTZ COVER | Cu | — | 46.1 | — | |
FIG. 8
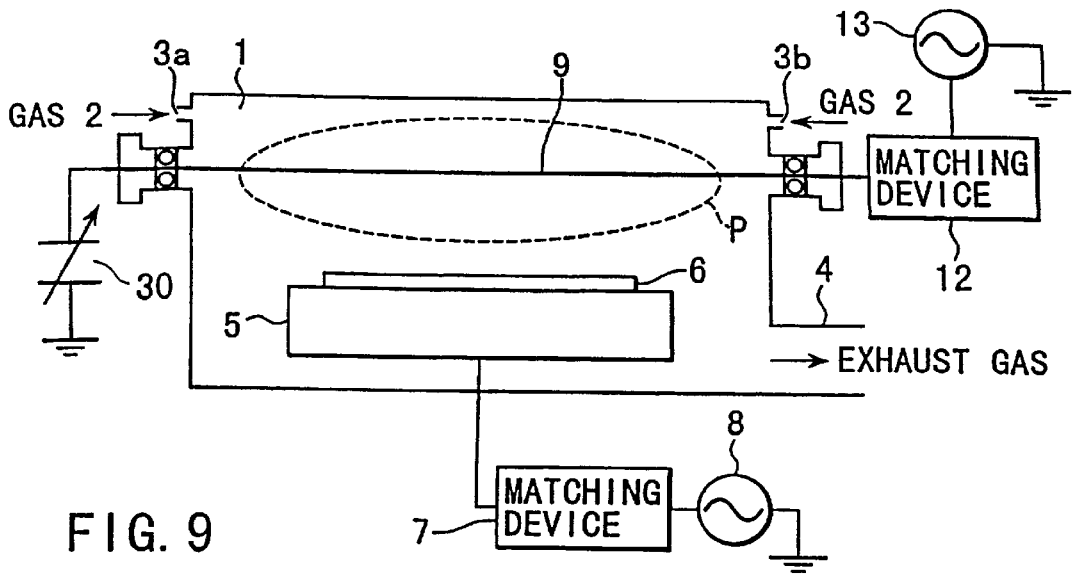
FIG. 9

|  | TYPE | Ar PLASMA | | | |
| --- | --- | --- | --- | --- | --- |
|  |  | 40W | 100W | 200W | 400W |
| Vi [V] | a | 45 | 40 | 34 | 28 |
|  | b | 41 | 36 | 31 | 4 |
|  | c | 261 | 313 | 412 | 560 |
| V [V] | a | 150 | 170 | 207 | 260 |
|  | b | 149 | 173 | 214 | 275 |
|  | c | 289 | 345 | 455 | 617 |
| I [A] | a | 3.8 | 5.0 | 7.0 | 10.2 |
|  | b | 3.8 | 5.2 | 7.4 | 10.5 |
|  | c | 3.3 | 4.2 | 6.0 | 8.7 |
| LUMINOUS INTENSITY [a. u] | a | 0.005 | 0.110 | 0.220 | 1.100 |
|  | b | 0.009 | 0.360 | 0.740 | 1.150 |
|  | c | 0.039 | 0.100 | 0.240 | 0.890 |

FIG. 15

CONDENSER CAPACITY IN EACH TYPE

| TYPE | Cf | Ci |
| --- | --- | --- |
| a | 0 | 350pF |
| b | 350pF | 0 |
| c | 0 | 0 |

FIG. 16

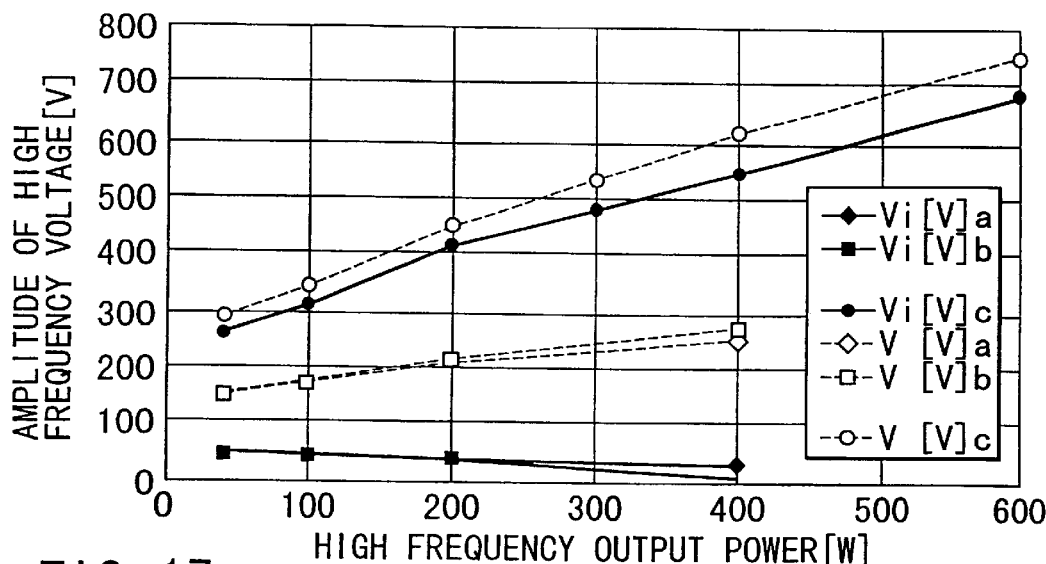
FIG. 17
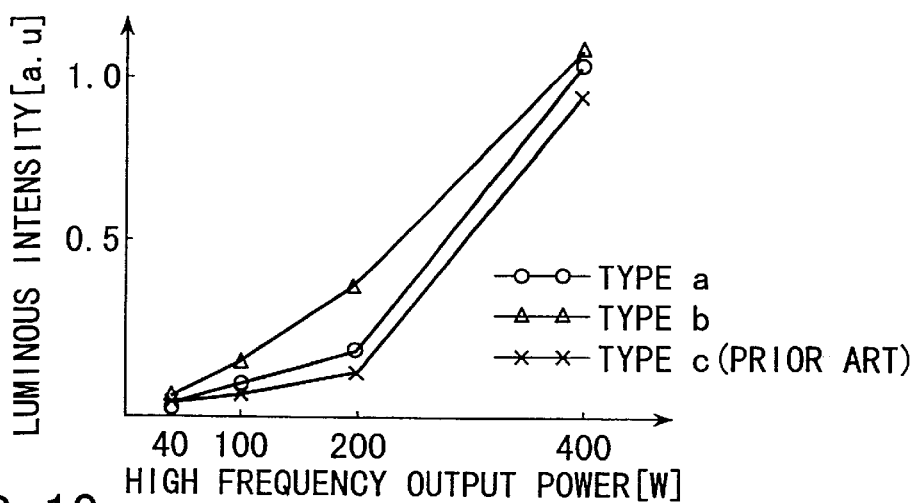
FIG. 18
| | TYPE | O2 PLASMA | | | | |
|---|---|---|---|---|---|---|
| | | 40W | 100W | 200W | 400W | 600W |
| LUMINOUS INTENSITY [a.u] | a | 10.30 | 10.90 | 4.40 | 1.70 | 1.50 |
| | b | 5.60 | 8.40 | 4.10 | 1.60 | 0.93 |
| | c | 12.50 | 12.30 | 9.50 | 4.90 | 3.20 |
FIG. 19

SHEATH THICKNESS=9.5mm

SHEATH THICKNESS=4.1mm

SHEATH THICKNESS=1.2mm

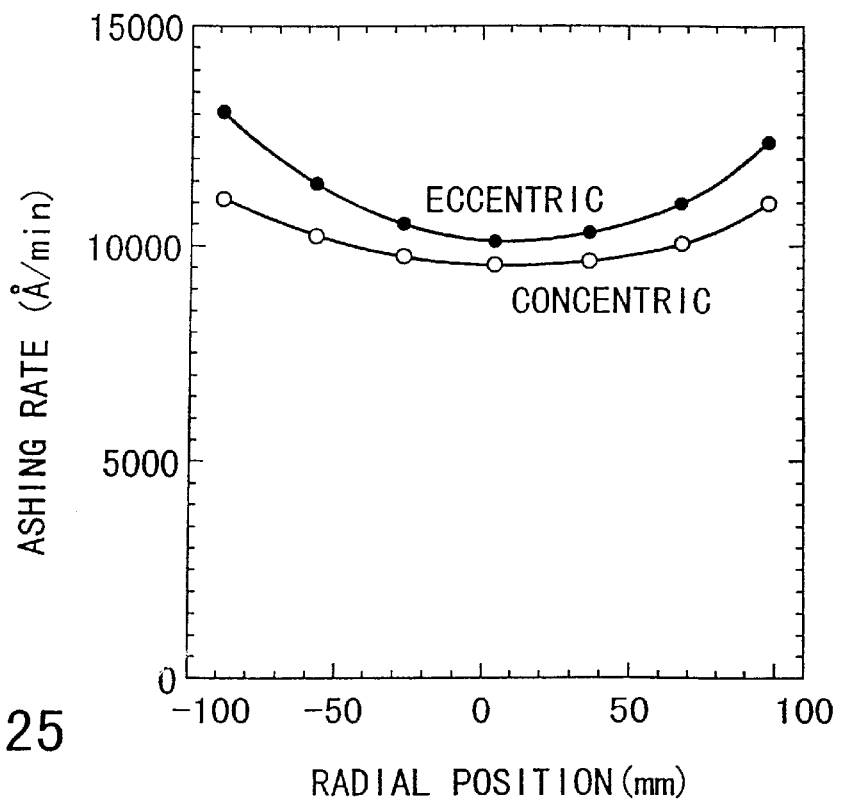
FIG. 25
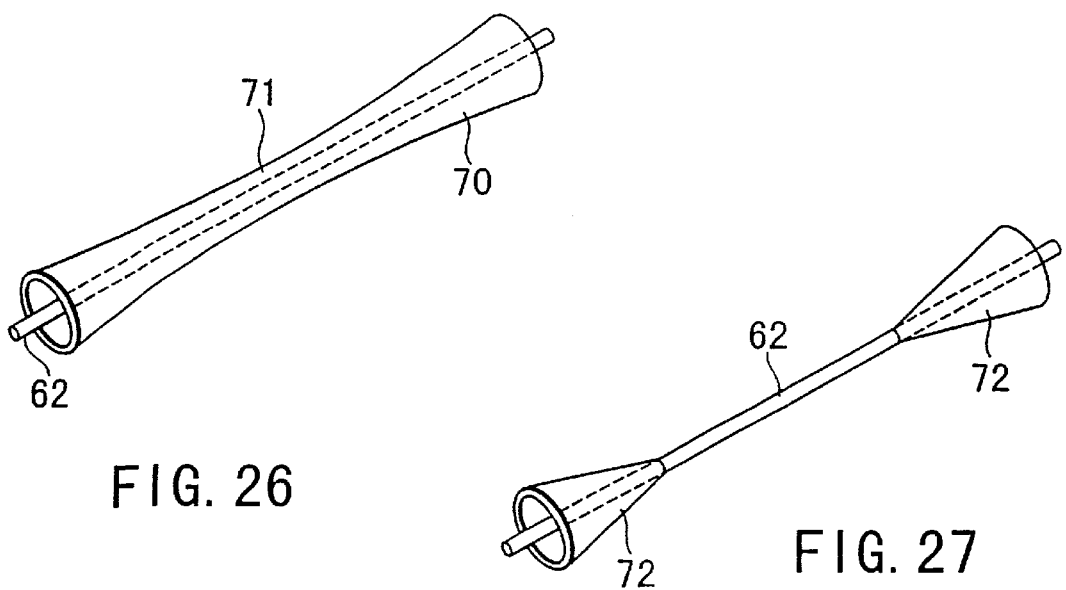
FIG. 26
FIG. 27

HIGH FREQUENCY DISCHARGING METHOD AND APPARATUS, AND HIGH FREQUENCY PROCESSING APPARATUS

This application is a continuation of application Ser. No. 09/251,486 filed on Feb. 17, 1999, now U.S. Pat. No. 6,181,069.

BACKGROUND OF THE INVENTION

Field of the Invention

The present invention relates to a high frequency discharging method and an apparatus thereof, and a high frequency processing apparatus which are, for example, used for the manufacturing of a thin film element on a semiconductor wafer, or the particle beam source or the plasma source of an analyzer, a heating device, or the like.

An element having a thin film whose components are metal, semimetal, semiconductor, oxide, nitride, arsenic, and the like (hereafter, simply referred to as a thin film element), is applied to main surface portions of various types of products and devices, for example, recording products such as an LSI, a magnetic record, or an optical record, or to communication devices such as a semiconductor laser or a photoelectric transfer element, or to flat-panel displays such as an LCD, or to image pick-up devices such as a CCD, or to energy devices such as a solar battery. This use of thin films is expected to develop even further in the future, as an essential part of miniaturization and enhancement of efficiency of devices. important in, for example, etching or CVD processes. Then, the area of a substrate of a object used in the manufacturing process has become larger from the viewpoint of improving productivity.

In order to achieve such a manufacturing process, an inductively coupled type of high frequency plasma apparatus is attracting attention. Usually, this inductively coupled type of high frequency plasma apparatus is arranged such that an antenna shaped like a loop (hereafter, simply referred to as a loop antenna) is arranged outside a vacuum container and an induction field is generated by allowing a high frequency current to flow to the antenna. This induction field is added to the gas in the vacuum container and plasma is created.

The induction field generated by the antenna is added to the gas in the vacuum container through a dielectric window provided in the vacuum container, and high frequency power is coupled with the plasma through the induction field.

There is also an internal antenna type system having a loop antenna arranged inside the interior of the vacuum container and a high frequency current is allowed to flow in the antenna so as to create the plasma. Since the distance between the antenna and the plasma is short, the high frequency power from the antenna to the plasma is efficiently transmitted and plasma with a high density can easily be created.

An example of an internal antenna type plasma processing apparatus used for sputtering is described in Jpn. Pat. Appln. KOKAI Publication No. 7-18433, and an example of this technique used for CVD is described in Jpn. Pat. Appln. KOKAI Publication No. 8-81777.

In this type of inductively coupled type high frequency discharge, an induction field is generated by the high frequency current flowing to the antenna and an electrostatic field is generated between the antenna and the plasma because of the potential of the high frequency voltage on the antenna.

In an external antenna system, a negative direct current self bias voltage arises on the surface of the dielectric window because of the generated electrostatic field. In an internal antenna system, a direct current self bias voltage arises due to the plasma surrounding the antenna itself. This direct current self bias voltage accelerates the ions in the plasma and the dielectric window or the antenna is itself sputtered. The phenomenon of such sputtering appears more noticeably in an internal antenna system since the distance between the antenna and the plasma is short.

The sputtering arises as to the antenna even in the state where the direct current bias voltage is nor applied to the antenna arranged in the interior of the vacuum container. See, for example, the technique described in Jpn. Pat. Appln. KOKAI Publication No. 7-18433.

However, if an internal antenna system is used in a process such as CVD or etching, the sputtered atoms and molecules have an adverse effect on the process as impurities.

That is, as the result of the electrostatic coupling between the antenna and the plasma, a negative direct current self bias voltage arises in the antenna or the dielectric near the antenna, and by the self bias voltage, the ions generated by the discharge are accelerated, and the dielectric or the material of the antenna is sputtered. For example, if the material of the antenna is copper, copper or ionized copper is deposited to adhere to the inner wall of the vacuum container or the object.

Furthermore, in an internal antenna system, the internal antenna is consumed by this sputtering and, therefore, the antenna must be periodically replaced by a new antenna as it is consumed. That is, it is treated as a replacement part.

When creating plasma with a uniform density in a large diameter vacuum container using an external antenna system, a complex and delicate shape of an antenna is often adopted.

On the other hand, in an internal antenna system, an antenna is treated as a replacement part as mentioned above and, therefore, it is required for an antenna to have the simplest possible structure in order to reduce the cost of replacing it.

BRIEF SUMMARY OF THE INVENTION

The present invention is made to correct the above situation, and an object thereof is to provide a high frequency discharging method and an apparatus thereof, in which an antenna arranged in a container has a simple structure.

Furthermore, another object of the present invention is to provide a high frequency processing apparatus in which an antenna arranged in a vacuum container has a simple structure and performs high frequency processing.

In one preferred embodiment, the high frequency discharging method comprising the steps of:

arranging a linear antenna in a container; and supplying high-frequency power to the linear antenna, thereby generating an induction field in the vacuum container and generating plasma therein.

Furthermore, a high frequency discharging apparatus comprising:

a linear antenna to which high-frequency electric power is supplied; and a container which contains the linear antenna, and in which plasma is generated by generating an induction field by the linear antenna.

Furthermore, the high frequency processing apparatus comprising:

a vacuum container for receiving gas for generating plasma and containing an object of process;

a power source for supplying high-frequency electric power;

a linear antenna provided in the vacuum container, for generating an induction field in the vacuum container when supplied with high frequency electric power from the power source, thereby to generate plasma to perform a process on the object contained in the vacuum container; and a condenser connected to a grounding side of the linear antenna, or between a plurality of linear antennas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a diagram showing a modified example in which 2 pieces of antennas are connected in parallel in the high frequency processing apparatus of the present invention;

FIG. 5 is a diagram showing the dependence of the power transmission efficiency Ps on the input high frequency power in an apparatus using a linear antenna;

FIG. 6 is a diagram of an external antenna type high frequency processing apparatus as a comparing object of an apparatus of the present invention;

FIG. 7 is a diagram showing the dependence of the power transmission efficiency $P_s$, on the input high frequency power in an apparatus using 2 pieces of linear antennas;

FIG. 8 is a diagram showing the experimental result of the amount of impurities generated by the spattering, in the case of arranging an internal linear antenna;

FIG. 9 is a diagram showing a second embodiment of a high frequency processing apparatus to which a high frequency discharging method according to the present invention is applied;

FIG. 15 is a diagram showing the measurements of high frequency voltage, voltage, current, and luminous intensity when Ar plasma is created in a high frequency processing apparatus;

FIG. 16 is a diagram showing the types of combination of each capacity of a floating condenser for obtaining the experimental results of a high frequency processing apparatus;

FIG. 17 is a diagram showing the amplitude of the high frequency voltage relative to the high frequency output power;

FIG. 18 is a diagram showing each luminous intensity relative to each capacity of a floating condenser;

FIG. 19 is a diagram showing the result of measurements of the thickness of the sheath;

FIG. 25 is a comparing diagram showing the state of the ashing rates of a concentrically provided internal linear antenna and an eccentrically provided internal linear antenna according to the third embodiment;

FIG. 26 is a view showing the shape of a quartz pipe whose central portion is concave according to a modified example of the third embodiment;

FIG. 27 is a view showing the shape of a quartz pipe which is provided on both end sides of an internal linear antenna according to a modified example of the third embodiment;

Figure 1:
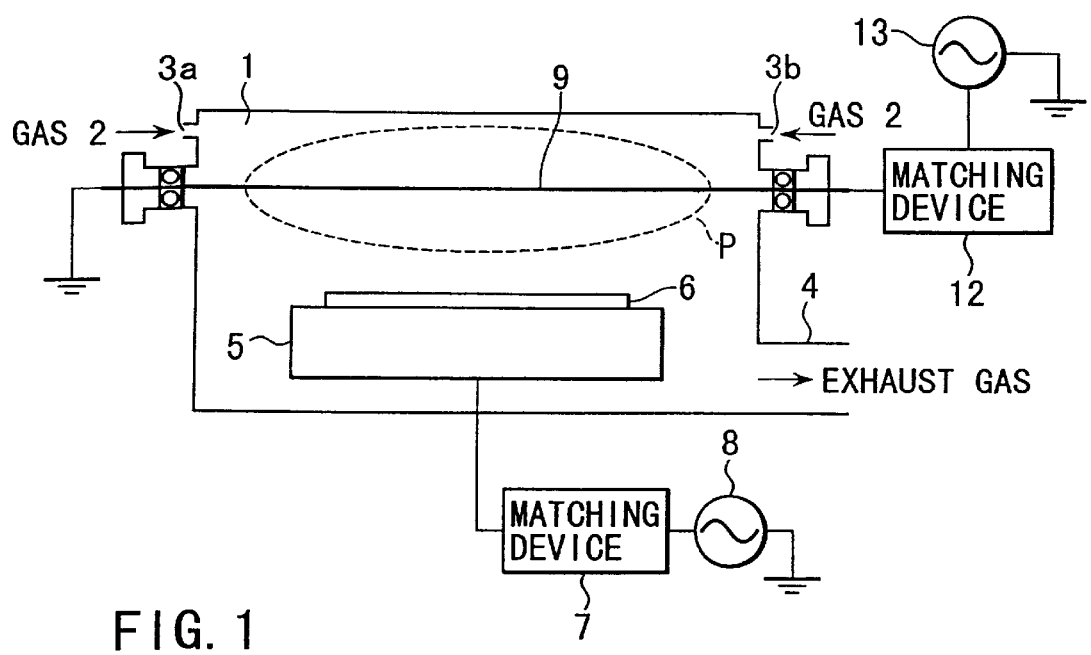
FIG. 1 is a diagram showing a first embodiment of a high frequency processing apparatus to which a high frequency discharging method according to one embodiment of the present invention is applied.

DETAILED DESCRIPTION OF THE INVENTION (1) A first embodiment of the present invention will be described below by referring to the drawings.

FIG. 1 is a block diagram of a high frequency processing apparatus to which the high frequency discharging method of the present invention is applied.

A plasma chamber 1 is provided as a vacuum container shaped, for example, like a cylinder. To the upper portion of plasma, gas introducing pipes 3a, 3b are connected for supplying gas 2 including process gas such as reactive gas for etching or material gas for a CVD process, a noble gas such as Ar, or the like. To the lower portion or plasma chamber 1, an exhaust pipe 4 is connected. The plasma chamber 1 can be shaped not only like a cylinder, but also like a cube, such as a quadrilateral.

Furthermore, an exhaust pump is connected through a pressure regulating valve, which is not illustrated, to the exhaust pipe 4. By the operation of the exhaust pump, the pressure in the plasma chamber 1 is kept at a desired pressure.

Furthermore, in the plasma chamber 1, a substrate stage 5 is provided. On the substrate stage 5, a workplace 6, to which etching or CVD processing is to be performed, is mounted. Furthermore, a power source 8 is connected to the substrate stage 5 through a matching device 7 to apply a bias of a given voltage to the substrate stage 5.

Moreover, in the plasma chamber 1, a linear antenna (hereafter, referred to as an internal linear antenna) 9 is arranged, crossing the plasma chamber 1. While the antenna is called a linear antenna, it is sufficient that the internal linear antenna 9 is linear as a whole even if it has a portion that is partially bent.

Figure 2:
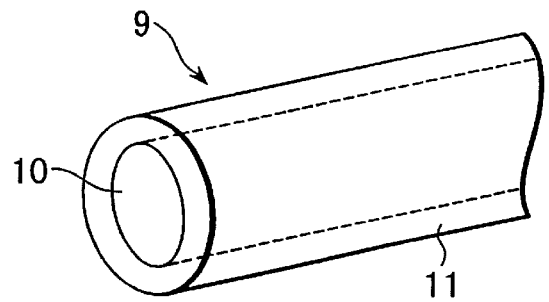
FIG. 2 is similarly a diagram of an antenna used in the high frequency processing apparatus.

The internal linear antenna 9 is formed from, for example, a conductive material such as copper or aluminum. As shown in FIG. 2, it is an antenna in which an insulating covering is given onto the periphery of an antenna which comprises a conductor 10 of, for example, a copper pipe. The covering insulating material is, for example, a quartz pipe 11 having a diameter of 15 mm that surrounds the inside copper pipe 10.

Thus, the antenna comprises a conductor 10 formed to have, for example, a diameter of 6 mm. On the inside of the copper pipe formed to conductor 10, a refrigerant flows, so that excessive temperature of the internal linear antenna 9 may be prevented.

Furthermore, the internal linear antenna 9 may be formed as a solid conductive metal antenna without having any surrounding insulating covering such that the antenna is made up of just a conductor 10.

To one end of the internal linear antenna 9, as shown in FIG. 1, a high frequency power source 13 is connected through a matching device 12, and the other end is grounded.

The matching device 12 comprises a condenser and a coil and functions to make sure there is no reflected electric power to the high frequency power source 13.

Next, modified examples of the arrangement of an antenna in the first embodiment will be described by referring to FIG. 3 and FIG. 4. The same reference characters are used relative to common components found in FIG. 1, and detailed description thereof will be omitted. A showing and discussion of the substrate stage 5 and the workpiece 6 mounted on the substrate stage 5 will also be omitted.

Figure 3:
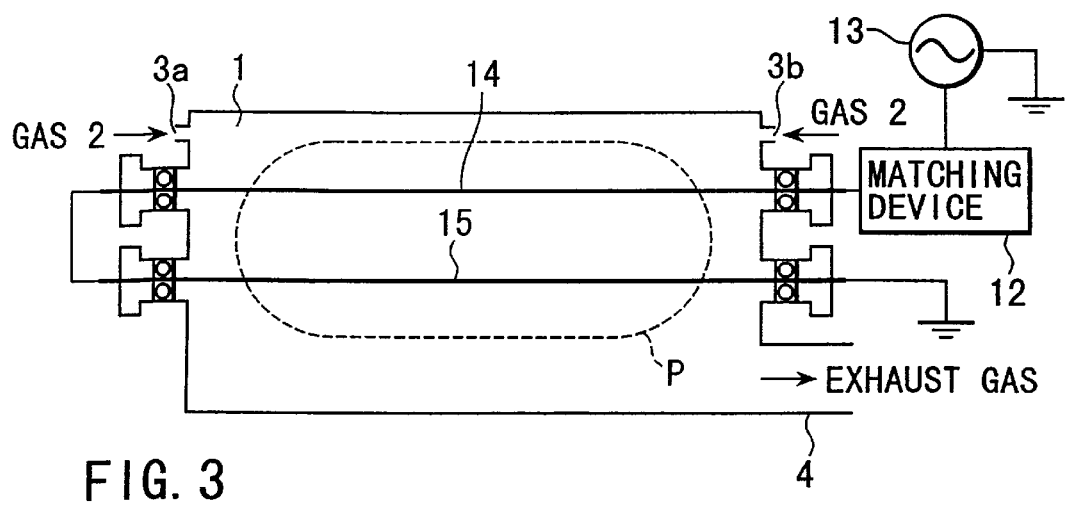
FIG. 3 is a diagram showing a modified example in which 2 pieces of antennas are connected in series in the high frequency processing apparatus of the present invention.

FIG. 3 is a diagram showing one example of a high frequency processing apparatus in which two internal linear antennas are connected in series.

In the plasma chamber 1, two internal linear antennas 14, 15 are arranged parallel to each other across the plasma chamber 1.

These two internal linear antennas 14, 15 are connected in series, with one end of one internal linear antenna 14 connected to the high frequency power source 13 through the matching device 12 and the other end of the other internal linear antenna 15 is connected to a ground potential.

These two internal linear antennas 14, 15 are formed from, for example, a conductive material such as copper or aluminum, similarly to the internal linear antenna 9. They are also antennas having an insulating covering around the periphery of the antenna core conductor formed, for example, as a copper pipe. The insulating material is, for example, formed as a quartz pipe having a diameter of 15 mm that surrounds a copper pipe formed to have, for example, a diameter of 6 mm. Inside, the copper pipe a refrigerant flows so that an excessive temperature of antennas 14, 15 may be prevented.

Furthermore, these internal linear antennas 14, 15 may be the solid antenna comprises conductors of metal without any insulating covering around the periphery of the antenna conductors.

FIG. 4 is a block diagram showing one example of a high frequency processing apparatus in which two internal linear antennas are connected in parallel.

In the plasma chamber 1, two internal linear antennas 16, 17 are arranged parallel to each other across the plasma chamber 1.

These internal linear antennas 16, 17 are connected in parallel and the ends on one side of these internal linear antennas 16, 17 which are connected in common with each other, are connected to the high frequency power source 13 through the matching device 12. The ends on the other side which are similarly connected in common with each other are grounded.

These internal linear antennas 16, 17 are formed from, for example, a conductive material such as copper or aluminum similarly to the internal linear antenna 9. An insulating covering can also be provided around the periphery of the antenna formed, for example, as a copper pipe. The insulating material can be formed, for example, as a quartz pipe having a diameter of 15 mm. The inside copper pipe can have, for example, a diameter of 6 mm. The inside of the copper pipe thereof, can further have a refrigerant flowing through it so that the temperature of antennas 16, 17 may be prevented from becoming too high.

Furthermore, these internal linear antennas 16, 17 may be solid conductive metal antenna, without any insulating covering around the periphery thereof.

Next, the action of a device arranged as mentioned above will be described.

In the device shown in FIG. 1, when a high frequency current flows through a 25 matching device 12 from a high frequency power source 13 to an internal linear antenna 9 shaped like a straight line and arranged in the interior of a plasma chamber 1, an induction field is generated around the internal linear antenna 9, and is added to process gas such as reactive gas, for etching or material gas for CVD also in the plasma chamber 1.

Consequently, plasma P is created and the processing, such as etching or thin film formation for the workplace 6, is performed.

In the device shown in FIG. 3, when a high frequency current flows through a matching device 12 from a high frequency power source 13 to two series connected internal linear antennas 14, 15 in the interior of a plasma chamber 1, an induction field is generated around these internal linear antenna 14, 15, and is added to the process gas, such as reactive gas for etching or material gas for CVD, also in the plasma chamber 1.

Consequently, plasma P is created and the processing, such as etching or thin film formation for the workpiece 6, is performed.

In the apparatus shown in FIG. 4, when a high frequency current flows through a matching device 12 from a high frequency power source 13 to the internal linear antennas 16, 17 which are connected in parallel in the interior of a plasma chamber 1, an induction field is generated around these internal linear antenna 16, 17, and is added to the process gas, such as reactive gas for etching or material gas for CVD, also in the plasma chamber 1.

Consequently, plasma P is created and the processing, such as etching or thin film formation for the workpiece 6, is performed.

The power transmission efficiency Ps from the inherent antenna to the plasma can be determined by the following expression:

$$P_s = (P_{rf} - R_a \cdot I_{rf}^2)/P_{rf} \tag{1}$$

Here, $P_{rf}$ is the output power of the high frequency power source 13 at the time of creation of the plasma P, and $I_{rf}$ is the high frequency current flowing to internal linear antennas 9, (14, 15), or (16, 17).

Furthermore, $R_a$ is the resistance of internal linear antennas 9, (14, 15), or (16, 17), and the value is found in such a way that the high frequency output power when high frequency power is supplied to each of the internal linear antennas 9, (14, 15), or (16, 17) without introducing the gas 2 into the plasma chamber 1 and plasma P is not created, is divided by the square of a current which flows to the internal linear antennas 9, (14, 15), or (16, 17) at that time.

By finding the power transmission efficiency $P_s$, a rate of high frequency power consumed for the creation of the plasma relative to high frequency power output during the creation of the plasma can be estimated.

In an experiment to measure such a power transmission efficiency $P_s$, the apparatus shown in FIG. 1 as including one piece internal linear antenna 9 was used and the plasma creating conditions were as follows:

flow rate of gaseous oxygen=100 sccm pressure=10 Pa high frequency power=20 to 800W FIG. 5 is a diagram showing the dependence of the power transmission efficiency Ps on the input high frequency power.

The diagram also shows the result of an external antenna type inductively coupled high frequency processing apparatus compared to the apparatus in which internal linear antenna 9 is arranged. This internal linear antenna 9 was covered by a quartz pipe 11 in order to prevent sputtering of a metal which has an effect on the process.

FIG. 6 shows a diagram of an external antenna type high frequency processing apparatus used for comparison.

This apparatus includes plasma chamber 18 with gas introducing pipes 19a, 19b connected to an upper portion thereof for supplying gas 2, such as reactive gas for etching, material gas for CVD, or some other process gas, or a noble gas of Ar or the like. The lower portion of chamber 18 is provided with an exhaust pipe 20.

An exhaust pump is connected through a pressure regulating valve, which is not illustrated, to the exhaust pipe 20. Through the operation of the exhaust pump, the pressure in the plasma chamber 18 is kept at a desired pressure.

Furthermore, in the plasma chamber 18, a substrate stage 21 is provided. On the substrate stage 21, a workpiece 22 to which etching or CVD processing to be preformed, is mounted.

Furthermore, at the upper portion of the plasma chamber 18, a quartz window 23 is provided. On the quartz window 23, a loop antenna 24 is provided.

The loop antenna 24 is made by winding a copper pipe by one turn. To one end of the antenna 24, a high frequency power source 26 is connected through a matching device 25, and the other end is grounded.

According to such an arrangement, when a high frequency current flows from the high frequency power source 26 to the loop antenna 24 through the matching device 25, an induction field is generated around the loop antenna 24. This induction field is added through the quartz window 23 to the process gas, such as reactive gas for etching or material gas for CVD, in the plasma chamber 1. Consequently, plasma P is created, and processing such as etching or thin film formation to the workplace 22, is performed.

However, from comparing the measurements of the power transmission efficiency Ps shown in FIG. 5 as to the apparatus having an internal linear antenna 9 and the apparatus having the external antenna system, it is clear that the apparatus using the internal linear antenna 9 has a higher power transmission efficiency $P_s$. In addition, it is clear that the apparatus of FIG. 1 has no problem relative to the creation of plasma.

Even though the apparatus with the internal linear antenna 9 has a magnetic flux density at the part creating the induction field that is smaller than that of the exterior loop antenna 24, the internal linear antenna 9 is adjacent to the plasma P and, therefore, a comparatively intense electric field is induced in the plasma so that most of the magnetic flux generated by the high frequency current may effectively contribute to the generation of the induction field.

Next, the measurements of the power transmission efficiency $P_s$ when two internal linear antennas are used is described.

FIG. 7 shows the measurements of the power transmission efficiencies $P_s$ of a total of four kinds of apparatus: each apparatus shown in FIG. 1, FIG. 3, and FIG. 4, in which an internal linear antenna is arranged in the plasma chamber 1, and an apparatus having the external antenna system shown in the FIG. 6. Furthermore, each internal linear antenna and the external are covered by a quartz pipe 11.

As shown in the diagram, in the area where the input high frequency power exceeds 500 W, the power transmission efficiency $P_s$ is high regardless of the coupling method of each antenna, and it is considered that an inductively coupled type discharge is performed.

In this area, the power transmission efficiency $P_s$ is approximately the same for the FIG. 1 and FIG. 3 arrangements and it is approximately the same for the FIG. 4 arrangement and in the case where an external antenna is used.

Thus, regardless of the number of internal linear antennas and the connecting method thereof, the power transmission efficiency Ps in the internal antenna system is approximately the same or larger than that in the external antenna system, and therefore, it is considered that the density of the plasma is also approximately the same or larger.

Therefore, by arranging a plurality of internal linear antennas in the plasma chamber 1, and by rationalizing the arrangement of these internal linear antennas, the plasma having a large diameter and a uniform density can be created.

Next, the measurements in the case where the internal linear antenna is covered by a quartz pipe 11 as shown in FIG. 2, will be described.

In an apparatus using one piece of internal linear antenna 9 as shown in the FIG. 1, as the result of the measurements of the electron density of Ar plasma, the electron density thereof became $2 \times 10E+11$ cm$^{-3}$ and it was confirmed that the plasma having a sufficiently high density could be created.

Furthermore, the impurities created by the sputtering of the internal linear antenna 9 were examined by an experiment in which the internal linear antenna 9 was formed as a conductor 10 covered by a quartz pipe 11 as shown in FIG. 2, and in which a solid metal conductor antenna was used.

The experimental method included creating Ar plasma by the apparatus shown in FIG. 1 having a semiconductor wafer with a film of poly-Si or Cu mounted on the substrate stage 5 as a workpiece 6. The presence of atoms and molecules sputtered on the semiconductor wafer was analyzed by using XPS (X-ray induction photoelectron spectroscopy).

FIG. 8 is a diagram showing the experimental result of the impurities created by the sputtering of the internal linear antenna 9. It is clear that in the case of there being no quartz pipe 11, Al is detected on the semiconductor wafer, and Al from the internal linear antenna 9 is sputtered and deposited on poly-Si. Since poly-Si was not detected, it is considered that the depth of the Al deposit was at least 50 angstroms or more considering the detectable depth of XPS.

On the other hand, in the case of cone 10 being covered by a quartz pipe 11, it is clear that sputtering of the quartz pipe 11 does not occur since Si was not detected and the elemental composition was equal to that of the untreated semiconductor wafer.

Thus, by covering the antenna cone conductor 10 with a quartz pipe 11, it is possible to prevent the creation of sputtered impurities which have an adverse effect on the process.

Thus, in the first embodiment, the structure of an antenna is linear, and it includes one antenna or a plurality of antennas connected in series or in parallel arranged in the interior of the plasma chamber 1. Therefore, the antenna to be arranged in the plasma chamber 1 is simple and can be easily made and has excellent efficiency of maintenance as to replacement. Plasma P having a high density can be created in the plasma chamber 1 using such an internal linear antenna.

Furthermore, in the case of creating a plasma having a large diameter and a uniform density, this can be achieved by a plurality of internal linear antennas connected in series or in parallel and arranged so that the density of the plasma is uniform.

Furthermore, since the antenna comprises a conductor 10 covered by an insulator, such as a quartz pipe 11, metal impurities generated by antenna sputtering can be prevented.

(2) A second embodiment of the present invention will be described below by referring to the drawings. Again, reference minerals that refer to parts that are the same as those in FIG. 1, FIG. 3, and FIG. 4, are the same and a detailed description thereof will be omitted.

FIG. 9 is a diagram of a high frequency processing apparatus to which the high frequency discharging method of the present invention is applied.

To one end of the internal linear antenna 9, a high frequency power source 13 is connected through a matching device 12, and the other end is grounded through a floating condenser 30.

The floating condenser 30 is variable in capacity. By changing the capacity $C_f$ of this floating capacitor, the high frequency voltage distribution on the internal linear antenna 9 is changed so as to control the electrostatic coupling between the internal linear antenna 9 and the plasma P.

Figure 10A:
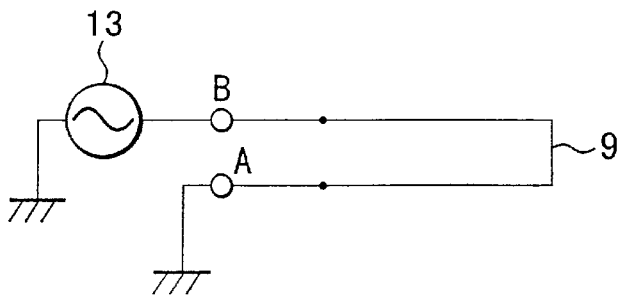
FIG. 10A is diagram showing a modification of the second embodiment in which no floating condensers are connected to the internal linear antenna.
Figure 10B:
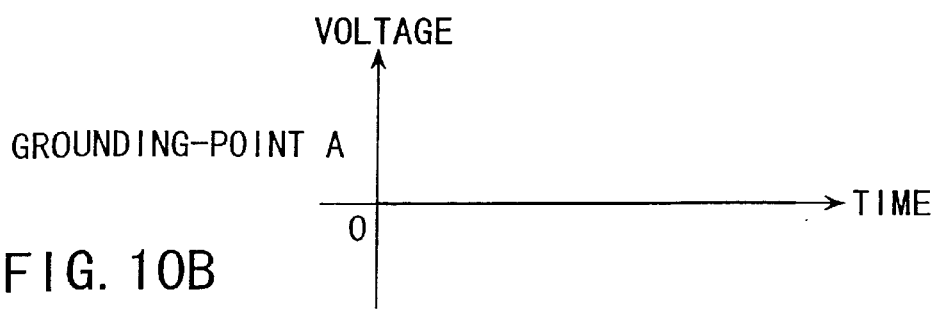
FIG. 10B is diagram illustrating how the voltage between point A and the grounding point changes with time in the modification shown in FIG. 10A.
Figure 10C:
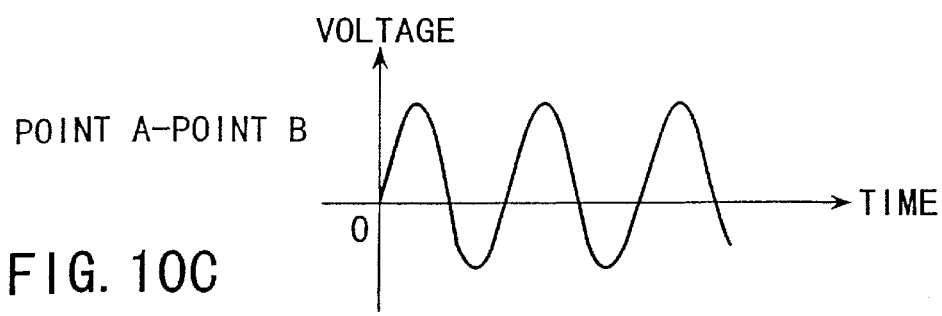
FIG. 10C is a diagram showing how the voltage between points A and B changes with time in the modification shown in FIG. 10A.
Figure 10D:
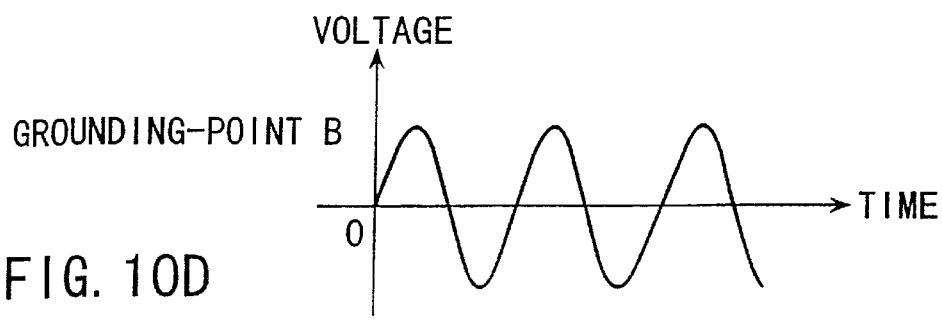
FIG. 10D is a diagram explaining how the voltage between point B and the grounding point changes with time in the modification shown in FIG. 10A.

That is, as shown in FIG. 10A, if the floating condenser 30 is not connected to the internal linear antenna 9, the voltage of the point A relative to ground is 0V as shown in FIG. 10B. As shown in FIG. 10C, a wave form of the voltage corresponding to the voltage of the high frequency power source 13 appears between points A and B. The wave form is the same as for the voltage of the point B to relative ground as shown in FIG. 10D.

Figure 11A:
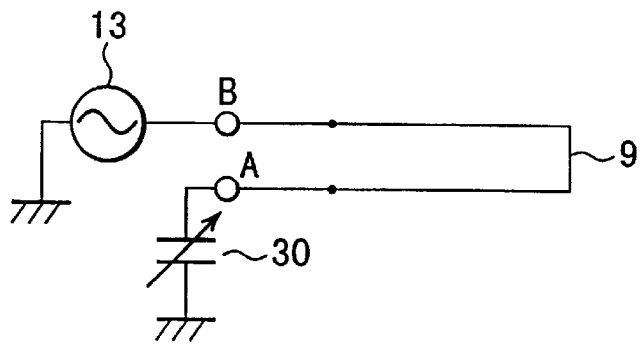
FIG. 11A is a diagram showing another modification of the second embodiment in which a floating condenser is connected to the internal linear antenna.
Figure 11B:
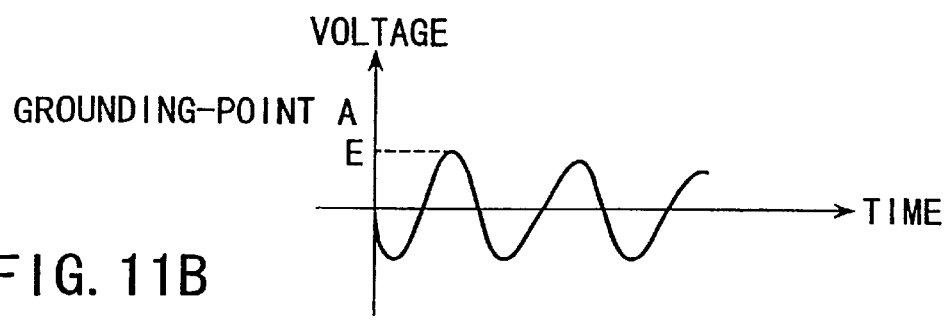
FIG. 11B is a diagram illustrating how the voltage between point A and the grounding point changes with time in the modification shown in FIG. 11A.
Figure 11C:
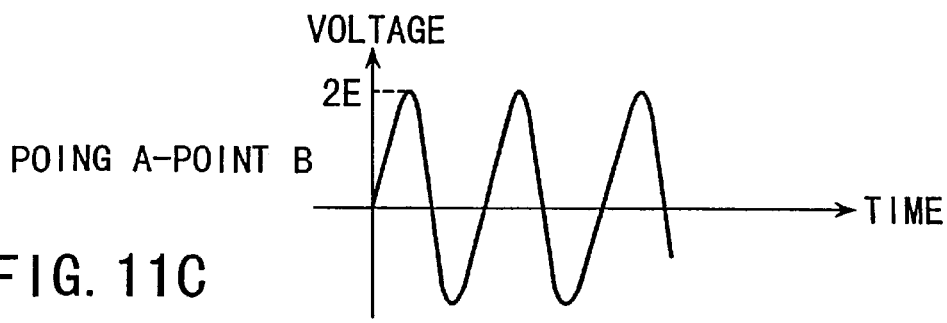
FIG. 11C is a diagram showing how the voltage between points A and B changes with time in the modification shown in FIG. 11A.

On the other hand, as shown in FIG. 11A, if the floating condenser 30 is connected to the internal linear antenna 9, a voltage which has a phase opposite to the phase of the voltage shown in FIG. 11C and half the amplitude of the FIG. 11C voltage appears at the point A (as shown in FIG. 11B) because of the voltage drop of the floating condensor 30.

Figure 11D:
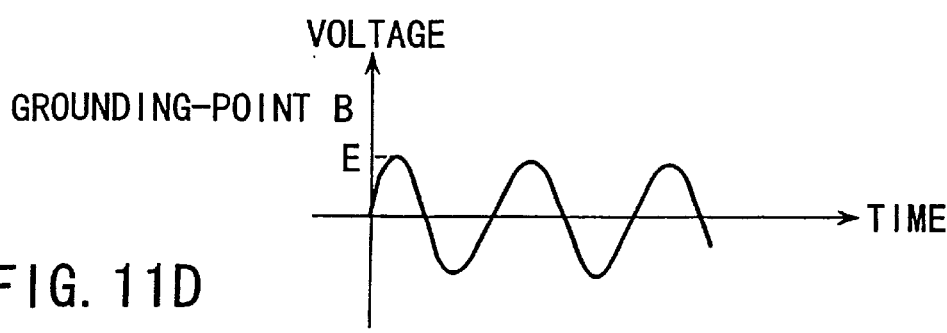
FIG. 11D is a diagram explaining how the voltage between point B and the grounding point changes with time in the modification shown in FIG. 11A.

Accordingly, the voltage of the point B has a wave form resulting from the addition of the voltage having an opposite phase because of the floating condenser 30 (shown in FIG. 11B) with the voltage between the point A and the point B (shown in FIG. 11C). This resultant voltage has a small maximum value and phase as shown in FIG. 11D.

Accordingly, by changing the capacity of $C_f$ of the floating condenser 30, the voltage distribution on the internal antenna 9 is changed, so that the voltage of an arbitrary point on the internal linear antenna 9, for example, the intermediate point between the point A and the point B, may be controlled to be as small as 0V. Then, in this case, the high frequency voltage measured from ground to the point B becomes half of that in the case of no floating condensor and the electrostatic coupling can be considerably reduced.

Next, a modified example of the arrangement of an antenna in the second embodiment will be described by referring to FIG. 12 and FIG. 13. Again, the same reference numerals have been used for components that are the same as those in FIG. 9, and a detailed description thereof will be omitted. A discussion of the substrate stage 5 and the workpiece 6 mounted on the substrate stage 5 will also be omitted.

Figure 12:
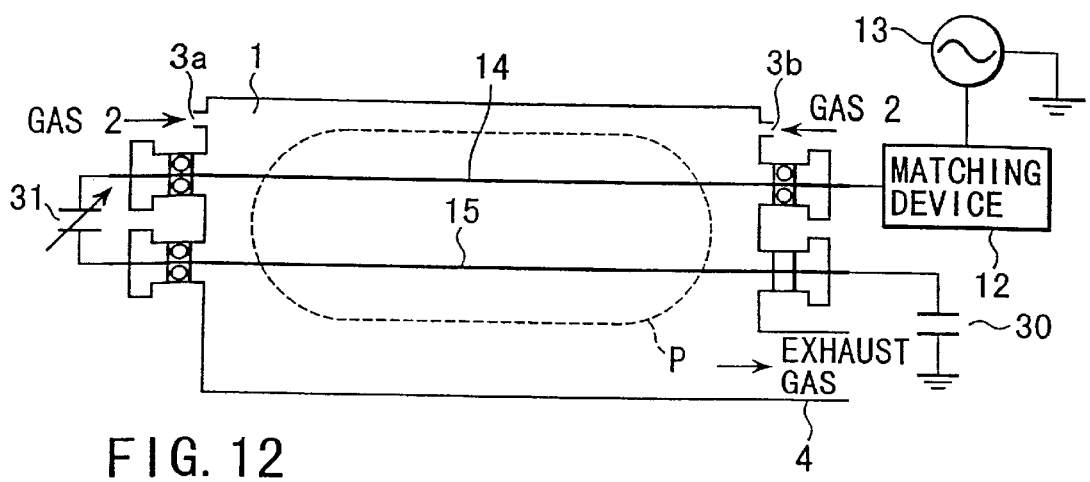
FIG. 12 is a block diagram showing a modified example in which 2 pieces of antennas are connected in series in a high frequency processing apparatus of the present invention.

FIG. 12 is a diagram of a high frequency processing apparatus in which two internal linear antennas 14, 15 are connected in series.

Between the two internal linear antennas 14, 15, an intermediate condenser 31 is connected between the internal linear antenna 15 and ground, a floating condenser 30 is connected. The intermediate condenser 31 is also a condenser to control the electrostatic coupling between each of internal linear antennas 14, 15 and the plasma P, similarly to the floating condenser 30.

That is, each of the floating condenser 30 and the intermediate condenser 31 has a variable capacity, such that changing each of the capacities $C_i$, $C_f$ causes the high frequency voltage distribution on each of the internal linear antennas 14, 15 to be changed, so that the electrostatic coupling between these internal linear antennas 14, 15 and the plasma P may be controlled.

Figure 13:
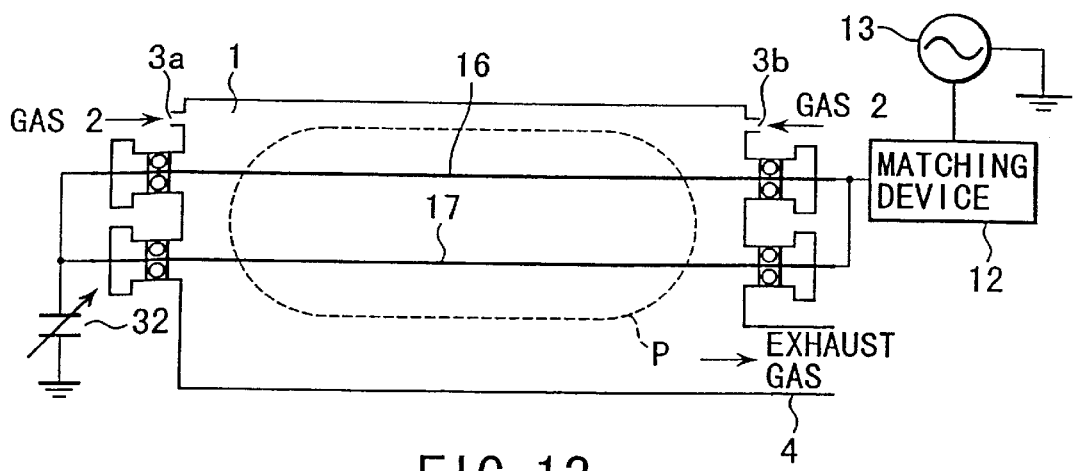
FIG. 13 is a block diagram showing a modified example in which 2 pieces of antennas are connected in parallel in a high frequency processing apparatus of the present invention.

FIG. 13 is a diagram of a high frequency processing apparatus in which two internal linear antennas 16, 17 are connected in parallel.

To one end of these two parallel connected internal linear antennas 16, 17, a high frequency power source 13 is connected through a matching device 12 and the other end is grounded through a floating condenser 32.

The floating condenser 32 has a variable capacity and by changing the capacity $C_g$ thereof, the high frequency voltage distribution on each of the internal linear antennas 16, 17 is changed, so that the electrostatic coupling between these internal linear antennas 16, 17 and the plasma P may be controlled.

Next, the action of an apparatus arranged as mentioned above will be described.

In the apparatus shown in FIG. 9, when a high frequency current flows from a high frequency power source 13 to an internal linear antenna 9 arranged in the interior of a plasma chamber 1, an induction field is generated around the internal linear antenna 9, and the induction field is added to process gas, such as reactive gas for etching or material gas for CVD, in the plasma chamber 1.

Consequently, the plasma P is created, and the processing such as etching or thin film formation for the workplace 6 is performed.

At this moment, the floating condenser 30, whose capacity $C_f$ is regulated, changes the high frequency voltage distribution on the internal linear antenna 9, and it controls the electrostatic coupling between the internal linear antenna 9 and the plasma P.

In the apparatus shown in FIG. 12, when a high frequency current is allowed to flow in series from a high frequency power source 13 to the two internal linear antennas 14, 15, an induction field is generated around these internal linear antennas 14, 15, and the induction field is added to process gas such as reactive gas for etching or material gas for CVD, in the plasma chamber 1.

Consequently, the plasma P is created, and the processing such as etching or thin film formation for the workpiece 6 is performed.

At this moment, the floating condenser 30 and the intermediate condenser 31, whose capacities $C_f$, $C_i$ are regulated, changes the high frequency voltage distribution on the internal linear antennas 14, 15, and controls the electrostatic coupling between these two internal linear antennas 14, 15 and the plasma P.

In the apparatus shown in FIG. 13, when a high frequency current flows in parallel from a high frequency power source 13 to the two internal linear antennas 16, 17 arranged in the interior of the plasma chamber 1, an induction field is generated around these internal linear antennas 16, 17, and the induction field is added to the process gas, such as reactive gas for etching or material gas for CVD, in the plasma chamber 1.

Consequently, the plasma P is created, and the processing such as etching or thin film formation for the workplace 6 is performed.

At this moment, the floating condenser 32, whose capacity $C_g$ is regulated, changes the high frequency voltage distribution on the two internal linear antennas 16, 17, and controls the electrostatic coupling between these two internal linear antennas 16, 17 and the plasma P.

Next, the experimental result as for the effects of a floating condenser and an intermediate condenser will be described.

The experiment uses an apparatus having internal linear antennas connected in series, and the change of the antenna voltage distribution according to the number of antennas and the position of floating condensers connected in series, is measured.

Figure 14:
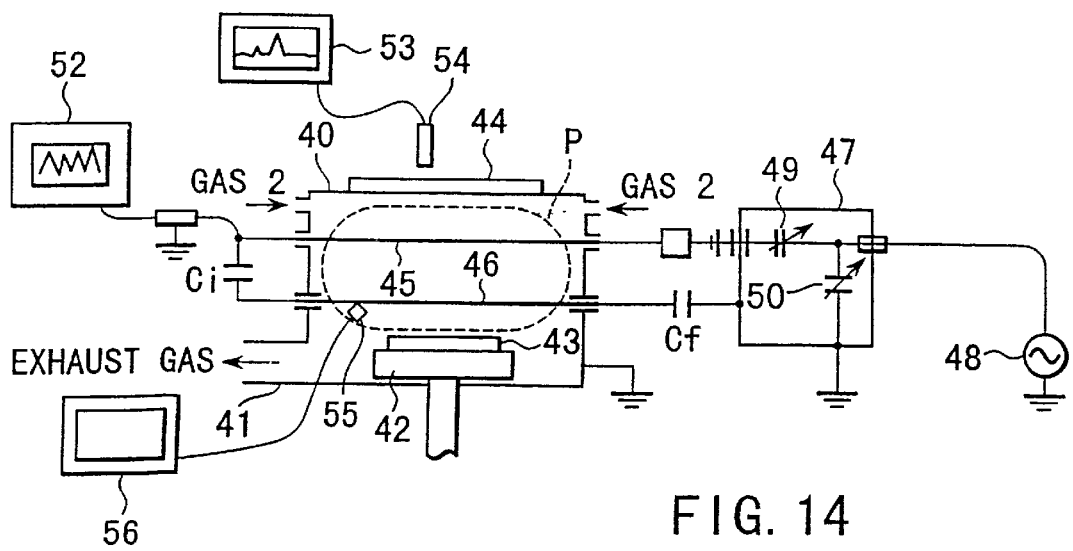
FIG. 14 is a diagram of a high frequency processing apparatus to be used in the experiment of a floating condenser.

FIG. 14 is a diagram of a high frequency processing apparatus used in such an experiment.

A plasma chamber 40 is shaped, for example, like a cylinder, and from the upper portion thereof, gas 2, such as process gas of reactive gas for etching, material gas for CVD, or the like, or a noble gas of Ar or the like, is supplied to the interior of the chamber.

Furthermore, to the lower portion of the plasma chamber 40, an exhaust pipe 41 is connected. To the exhaust pipe 41, an exhaust pump is connected through a pressure regulating valve, which is not illustrated, and by the operation of the exhaust pump, the pressure in the plasma chamber 1 is kept at a desired pressure.

Furthermore, in the plasma chamber 40, a substrate stage 42 is provided. On the substrate stage 42, a workpiece 43 to which etching or CVD processing is performed, is mounted.

Furthermore, at the upper portion of the plasma chamber 40, a quartz window 44 is provided.

Furthermore, in the plasma chamber 40, two internal linear antennas 45, 46 are arranged to extend in parallel across the plasma chamber 40 and are connected in series.

These internal linear antennas 45, 46 are arranged as a conductor formed from, for example, a copper pipe having a diameter of 6 mm that is surrounded by a quartz pipe having a diameter of 15 mm. Inside the antenna copper pipe or conductor 10, a refrigerant flows, so that excessive temperature of the internal linear antennas 45, 46 may be prevented.

One end of the internal linear antenna 45 is connected to a high frequency power source 48 through a matcher 47 contained in a case of conductive material.

The matcher 47 comprises each of condensers 49, 50, which has a variable capacity and determines the capacity to perform matching.

Furthermore, between the two internal linear antennas 45, 46, an intermediate condenser $C_i$ is connected. To the other end of the internal linear antenna 46, a floating condenser $C_f$ is connected.

To such an apparatus, each of the following measuring devices are provided.

Between the internal linear antenna 45 and the matcher 47, an RF probe 51 is provided, and it is arranged that by the RF probe 51, to measure the current I and the voltage V.

Furthermore, between the internal linear antenna 45 and the intermediate condenser $C_i$, an oscilloscope 52 is connected through a high voltage probe in which input: output is 10000: 1, to measure the high frequency voltage Vi is measured.

On the other hand, a probe (light receiving portion) 54 of an emission spectrophotometer 53 is arranged above the quartz window 44 to measure the luminous intensity of Ar or O.

On the other hand, a CCD camera 55 is arranged in the plasma chamber 40 and the output picture signal from the CCD camera 55 is sent to a television monitor 56.

The CCD camera 55 picks up the image of the sheath created near each of the peripheries of the two internal linear antennas 45, 46, and outputs the picture signal thereof.

The sheath is made in such a way that the luminous intensity is extremely small around the periphery of each of internal linear antennas 45, 46, because of the small number of electron collision reactions.

In the sheath area, if the thickness of the sheath is large, the electric field becomes intense and ions having high energy come into each of the internal linear antennas 45, 46, so that sputtering may be generated. On the contrary, if the thickness of the sheath is small, the electric field is less intense and ions having low energy come into each of internal linear antennas 45, 46.

Accordingly, if the thickness of the sheath becomes small, ions having low energy come into each of internal linear antennas 45, 46, and therefore, the impurities from each of internal linear antennas 45, 46, do not adhere to the workpiece 43.

Next, the measurements to the floating condenser and the intermediate condenser, which are found by using each of the above measuring devices will be described.

FIG. 15 shows the measurements of the high frequency voltage Vi, the voltage V, the current I, and the luminous intensity when Ar plasma is created in the plasma chamber 40 and the electric power of the Ar plasma is changed to 40 W, 100 W, 200 W, and 400 W.

These measurements were obtained by performing the measuring for each of the types a, b, and c which are made by changing the combination of the respective capacities of the floating condenser $C_f$ and the intermediate condenser $C_i$ as shown in FIG. 16.

The type c, in which the respective capacities of the floating condenser $C_f$ and the intermediate condenser $C_i$ are both zero, represents the conventional device and is shown for the purpose of comparison with the device of the present invention.

Furthermore, FIG. 17 shows the amplitude of the high frequency voltage to the high frequency output power for the high frequency voltage Vi and the voltage V in each of the types a, b, and c.

Furthermore, FIG. 18 shows each luminous intensity for each of the types a, b, and c. It is clear from the diagram that the luminous intensity is highest in the case of the type b, that is, in the case where the capacity of the floating condenser $C_f$ is 350 pF, the capacity of the intermediate condenser $C_i$ is zero, and the capacity of the additional condenser Ca is 150 pF.

The luminous intensity approximately corresponds to the plasma electron density, and it is shown that if the density thereof is high, the plasma electron density is high.

Accordingly, the above experimental result shows that the type b has the highest plasma electron density even if it is compared with a conventional device (type c).

Figure 20:
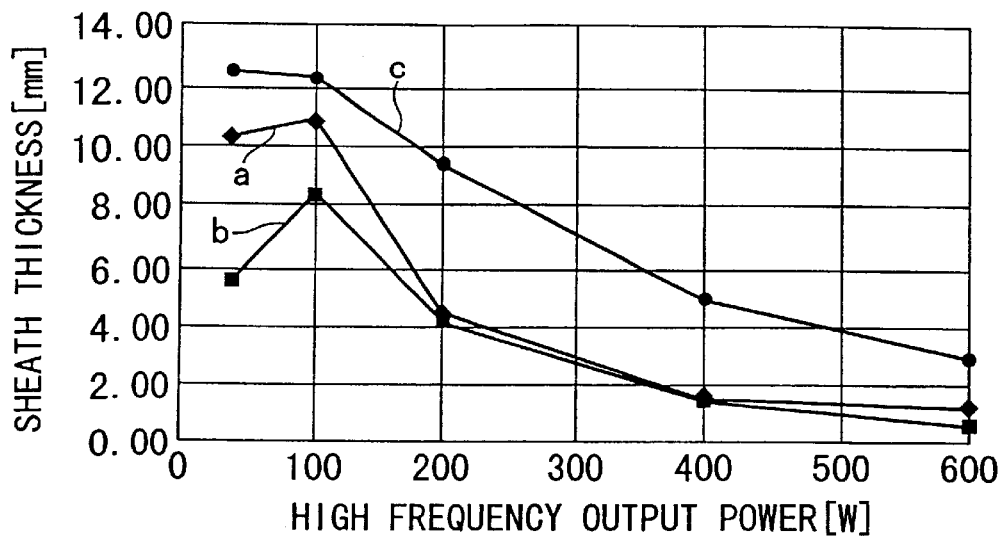
FIG. 20 is similarly a diagram in which the result of measurements of the thickness of the sheath are graphically shown.

On the other hand, FIG. 19 shows the measurements of the sheath thickness obtained by the image pick up of a CCD camera 55 when $O_2$ plasma is created in the plasma chamber 40 and the electric power of the $O_2$ plasma is changed to 40 W, 100 W, 200 W, 400 W, and 600 W, and FIG. 20 shows a graphic diagram thereof.

It is clear from these diagrams that the sheath thickness is smaller when the high frequency output power is larger, and in these, the sheath thickness of the types a, b is smaller, and therefore, the amount of sputtering from the internal linear antenna is limited and the impurities in etching or CVD can be reduced.

Furthermore, the measurement of the sheath thickness was also performed in the case where the floating condenser $C_f$ and the intermediate condenser $C_i$ was connected to two internal linear antennas, and in the case where no condenser was connected.

Figure 21A:
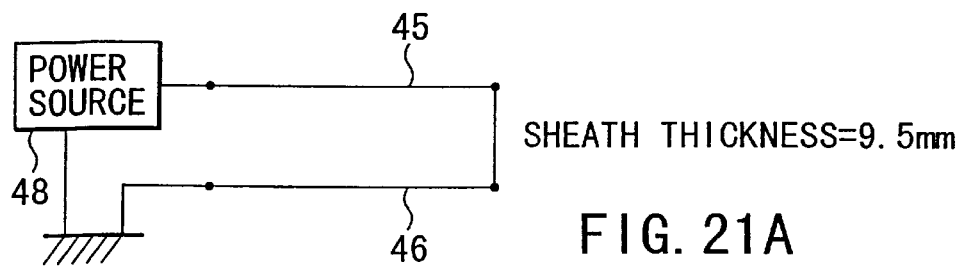
FIG. 21A is a diagram showing a modification of the circuit for measuring sheath thickness in which neither a floating condenser nor an intermediate condenser is connected to the internal linear antenna.
Figure 21B:
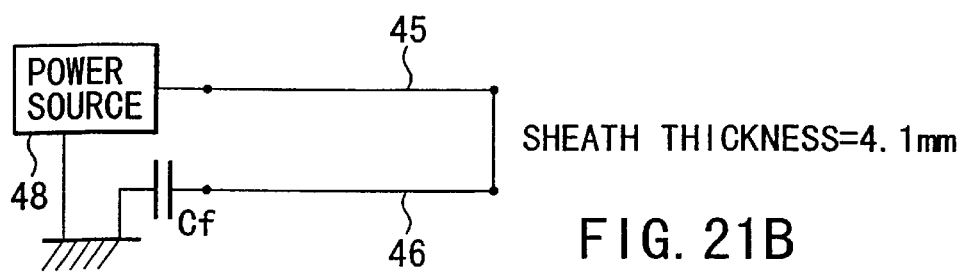
FIG. 21B is a diagram depicting another modification of the circuit for measuring sheath thickness in which only a floating condenser is connected to the internal linear antenna.
Figure 21C:
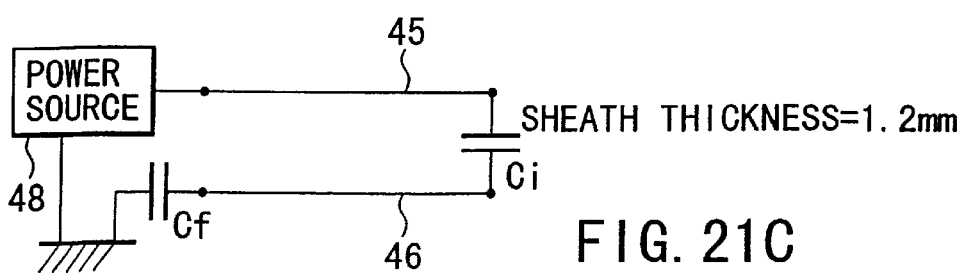
FIG. 21C is a diagram depicting still another modification of the circuit for measuring sheath thickness, in which both a floating condenser and an intermediate condenser are connected to the internal linear antenna.

FIGS. 21A–21C are rough diagrams of the circuits used in such sheath thickness measurements. FIG. 21A is a diagram of the case where neither the floating condenser $C_f$ nor the intermediate condenser $C_i$ is connected. FIG. 21 B is a diagram of the case where only the floating condenser $C_f$ (for example, 350 pF) is connected, and FIG. 21C is a diagram in the case where both the floating condenser $C_f$ (for example, 700 pF) and the intermediate condenser $C_i$ (for example, 350 pF) are connected.

In these measurement circuits of the sheath thickness, the sheath thickness is 9.5 mm in the circuit shown in FIG. 21A, the sheath thickness is 4.1 mm in the circuit shown in FIG. 21B, and the sheath thickness is 1.2 mm in the circuit shown in FIG. 21C.

Accordingly, if the floating condenser $C_f$ and the intermediate condenser $C_i$ are connected, the sheath thickness becomes smaller and the impurities in etching or CVD are restrained.

Thus, In the second embodiment, a floating condenser 30 and/or an intermediate condenser 31 is connected between the internal linear antenna 9 and ground or between two internal linear antennas 14, 15 or the like, and by changing capacities $C_f$, $C_i$ of the floating condenser 30 and/or the intermediate condenser 31, the high frequency voltage distribution on the internal linear antenna 9 or the like is changed so that the electrostatic coupling between the internal linear antenna 9 or the like and the plasma P may be controlled, and consequently, the control of the electrostatic coupling between the internal linear antenna 9 or the like and the plasma P can be optimized in order to achieve compatibility between stabilizing the discharge of the plasma P and reducing sputtering of the internal linear antenna 9 or the like.

Consequently, ions are accelerated by the negative direct current self bias voltage, and for example, the material of the antenna is not sputtered onto the inner wall of the plasma chamber 1 or the workpiece 6 to increase the lifespan of the high frequency plasma apparatus and to prevent the adverse effect of such sputtering on process such as etching or CVD.

Furthermore, the antenna to be arranged in the plasma chamber 1 has a structure which makes it manufacturing easy and reduces the need for antenna replacement. The antenna is also simple and the plasma P can be created in the plasma chamber 1 with high density.

Furthermore, in the case of creating a plasma with a large diameter and uniform density, it can be achieved by using a combination of a plurality of internal linear antennas which are connected in series or in parallel so that the density of the plasma may be uniform.

Moreover, since the antenna comprises a conductor 10 surrounded by an insulator such as a quartz pipe 11, impurities generated by the sputtering of the antenna can be reduced or eliminated.

The present invention is not limited to the first and second embodiments as it can be modified in various ways.

For example, the number of antennas or the coupling method of the interior linear antennas is not limited to just that shown in the first and second embodiments. For example, a plurality of internal linear antennas can be connected mutually in series and/or in parallel across the chamber.

(3) A third embodiment of the present invention will be described below by referring to drawings. Again, the same reference numerals are used relative to components already discussed in the other figures and a detailed description thereof will be omitted.

Figure 22:
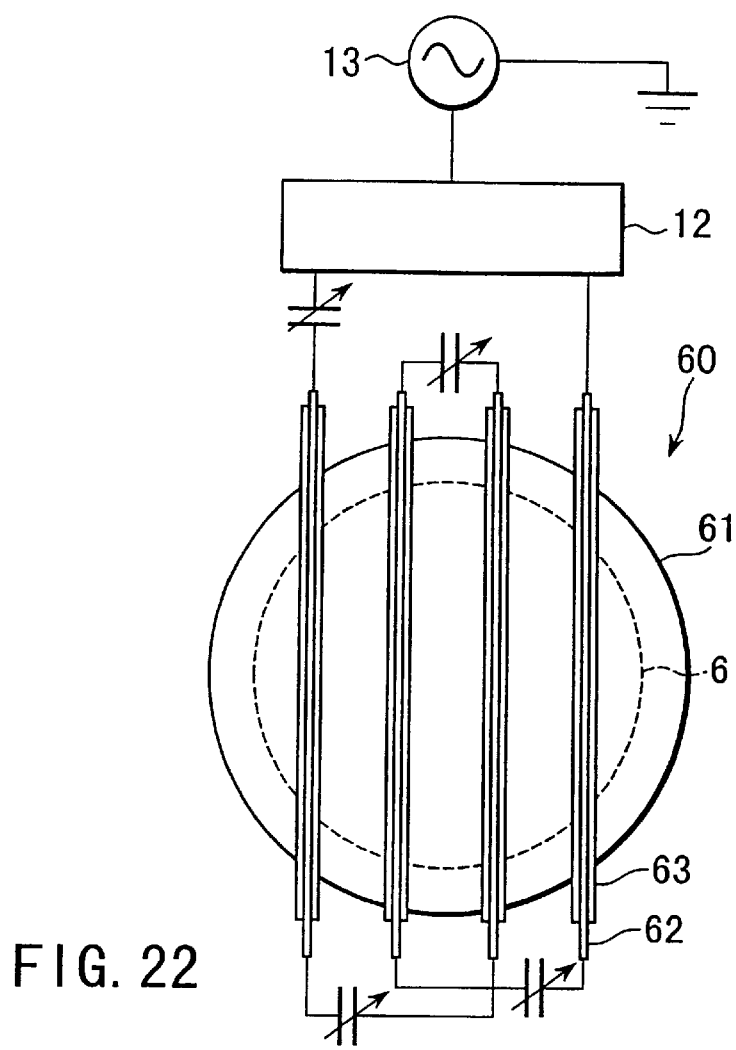
FIG. 22 is a block diagram showing a third embodiment of a high frequency processing apparatus to which a high frequency discharging method of the present invention is applied.

In the third embodiment, the arrangement is similar to that of a high frequency processing apparatus described in the first or second embodiments in that the internal linear antenna 62 is provided in the plasma chamber 61 of the high frequency processing apparatus 60 shown in FIG. 22. However, the antenna portion penetrate chamber sidewalls to have an exterior connecting portion.

Furthermore, the arrangement is also similar to that described in the previous embodiments in that the internal linear antenna 62 is covered by a pipe 63 made of a dielectric substance such as quartz. Furthermore, the shape of the quartz pipe 63 is also formed like a cylinder similarly to the other embodiments.

Figure 23:
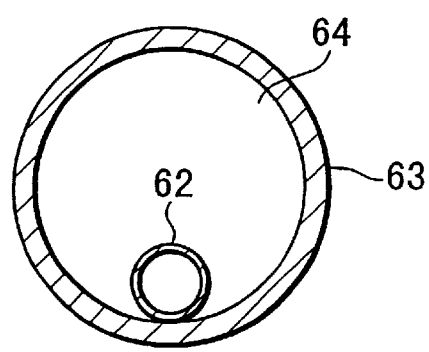
FIG. 23 is a diagram showing the state where an internal linear antenna is eccentrically provided to a quartz pipe, according to the third embodiment.

However, in the present embodiment, the internal linear antenna 62 is eccentrically arranged in a hollow portion 64 existing in the interior of the quartz pipe 63. More specifically, as shown in FIG. 23, the internal linear antenna 62 is in the interior of a hollow portion 64 having a diameter much larger than that of the internal linear antenna 62. The internal linear antenna 62 having a much smaller diameter compared to that of 63 touches the inner wall surface of the quartz pipe 63.

It is further arranged that the internal linear antenna 62 is eccentrically positioned on the inner wall surface of 63 toward the workpiece 6 side.

Figure 24:
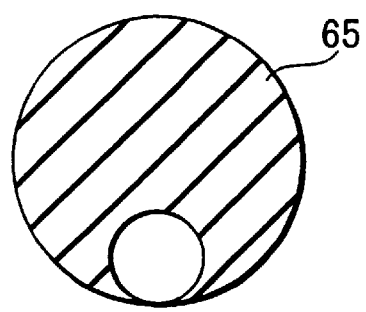
FIG. 24 is a diagram showing the shape of an antenna fastening member according to the third embodiment.

In order to achieve such an eccentric arrangement, an antenna fastening member 65, shown in FIG. 24, is attached to the quartz pipe 63 inserted into the upper portion side of the chamber 61 of the high frequency processing apparatus 60, on the end portion side thereof. As shown in FIG. 24, the outside diameter of the antenna fastening member 65 is formed to have such a size that it can be attached and fastened into the hollow portion 64 of the quartz pipe 63.

Here, the material of the antenna fastening member 65 comprises, for example, rubber, and the outside diameter of the antenna fastening member 65 is formed to have such a size such that it can be inserted into the open end portion of the quartz pipe 63 by being elastically deformed.

The internal linear antenna 62 may also be arranged in the state where it touches the inner wall surface of the hollow portion 64 without providing an antenna fastening member 65. It can also be in the state where it does not touch the inner wall surface on the workpiece 6 side of the hollow portion 64. However, even in this case. it is required for the internal linear antenna 62 to be arranged eccentrically toward the workpiece 6 side.

The operational effect of a high frequency processing apparatus 60 having the above arrangement will be described below.

When the high frequency power source 13 is operated and a high frequency current flows through a matching device 12, an induction field arises around the internal linear antenna 62 and the induction field is added to the process gas, such as reactive gas for etching or material gas for CVD, in the plasma chamber 61.

Consequently, the plasma P is created and the processing, such as etching or thin film formation to the workpiece 6, is performed.

In this case, the internal linear antenna 62 is eccentrically arranged so as to be nearer to the workplace 6 side in the interior of the quartz pipe 63. Therefore, to the front surface on the lower side of the quartz glass 63 (workpiece 6 side), an electric field can be generated, which is more intense than that in the case where it is not eccentrically arranged, such as in the other embodiments.

Furthermore, the front surface on the upper side of the quartz glass 63 (opposite side to the area where the workpiece 6 is provided) is provided so as to be far from the internal linear antenna 62. In this the area, the generation of the electronic field is weak.

Therefore, it becomes possible to limit the creation of useless plasma P in an area having no relation with the processing of the plasma for the workpiece 6, or the like. That is, it becomes possible to control the density distribution of the plasma P so that the density may be high only in the area to perform the processing on the workplace 6. Consequently, more efficient use of the high frequency current is provided.

Furthermore, in addition to the efficient use of the high frequency current, it becomes possible to limit sputtering at the inner wall surface of the area like this because the creation of the plasma P at the area having no relation with the processing of the plasma or the like is reduced. Consequently, this embodiment also contributes to a long life of the high frequency processing apparatus 60.

Here, the specific experimental result in the case of adopting this arrangement will be described below as to FIG. 25. In the experiment, four internal linear antennas 62 are arranged in parallel in a plasma chamber 61 with a diameter of 40 cm. The interior linear antenna 62 is a copper pipe with a diameter of 6 mm, and it is arranged to be inserted into a quartz pipe 63.

The diameter of the quartz pipe 63 is 25 mm and the internal linear antenna 62 touches the lower side of the quartz pipe 63. Consequently, the internal linear antenna 62 is provided in the state of being eccentric in the interior of the quartz pipe 63.

Furthermore, at a position 100 mm lower than the quartz pipe 63, a substrate for an 8 inch wafer is provided so that the thin film may be processed by the plasma.

A graph when the comparing experiment of the ashing rate of the resist is performed by using such a high frequency processing apparatus 60, will be shown below. The discharging condition in the case is as follows:

$O_2/CF_4$=680/120 scam, 100 mtorr, 1 kW.

In the case of performing the experiment under such a condition, the average ashing rate is 1.04 $\mu$m/min when the internal linear antenna 62 and the quartz pipe 63 are concentric. However, the average ashing rate rose to 1.04 $\mu$m/min with the above-noted eccentricity. That is, it rose by approximately 10%.

The result was caused in such a way that by developing the eccentricity, the density distribution in the axial direction was changed so as to raise the density distribution of the plasma P below the internal linear antenna 61.

From the above it is clear that the ashing rate can also be improved and the usefulness of the present invention is apparent.

As mentioned above, a third embodiment of the present invention has been described. However, variously modifications can be made. These modified examples will be described below.

FIG. 26 shows an example where the shape of a quartz pipe 70 is deformed and the central portion in the longitudinal direction of the quartz pipe 70 is a concave portion 71. Consequently, at the central portion of the quartz pipe 70, the clearance between the internal linear antenna 62 and the quartz pipe 70 becomes small and, consequently, it is possible to generate an intense electric field at the central portion on the front surface of the quartz pipe 70 and to raise the density of the plasma at the central portion.

Furthermore, in the arrangement shown in FIG. 27, quartz pipes 72 are provided only at both end portions of the internal linear antenna 62. These quartz pipes 72 are formed, for example, like a cone, and they are arranged to be respectively, separately, and independently attached to the internal linear antenna 62.

With such quartz pipes 72, the creation of the plasma P near the plasma chamber 61 is also reduced so that sputtering to the inner wall surface of the plasma chamber 61 or the like may be prevented. That is, the density of the plasma near the inner wall of the plasma chamber 61 is lowered.

Figure 28:
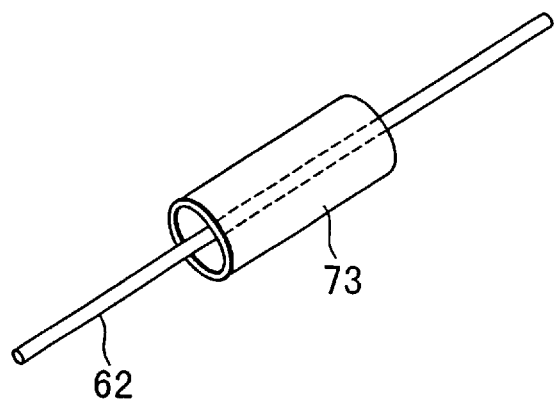
FIG. 28 is a view showing the shape of a quartz pipe which is positioned at the center of an internal linear antenna according to a modified example of the embodiment.

Furthermore, in the arrangement shown in FIG. 28, the central portion of the plasma chamber 61 of the internal linear antenna 62 is arranged to be covered by quartz pipe 73. With this arrangement, it is possible to reduce the density of the plasma at the central portion of the plasma chamber 61 and, consequently, it is possible to equalize the density of the plasma in the interior of the plasma chamber 61.

Figure 29:
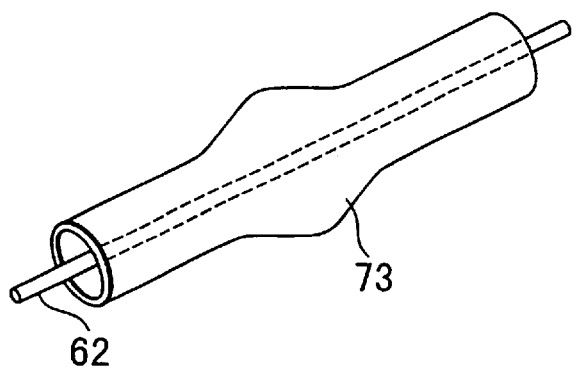
FIG. 29 is a view showing the shape of a quartz pipe whose diameter is formed to be large at the central portion, according to a modified example of the embodiment.

Furthermore, in the arrangement shown in FIG. 29, the diameter of the quartz pipe 73 is partially changed. For example, as shown in the diagram, by enlarging the diameter of the quartz pipe 73 at the central portion of the internal linear antenna 62, it is possible to change the density of the plasma on the lower side of the quartz pipe 73 according to the change of the diameter. Therefore, if the diameter of the quartz pipe 73 is changed at a desired position, it is possible to control the density of the plasma in the interior of the plasma chamber 61 according to that desired position.

Figure 30A:
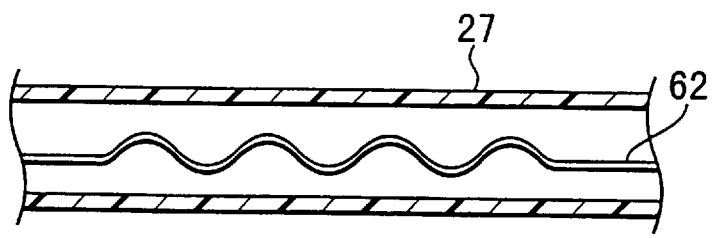
FIG. 30A is a diagram showing a modification of the third embodiment, in which the internal linear antenna inserted in the quartz pipe is meandering.
Figure 30B:
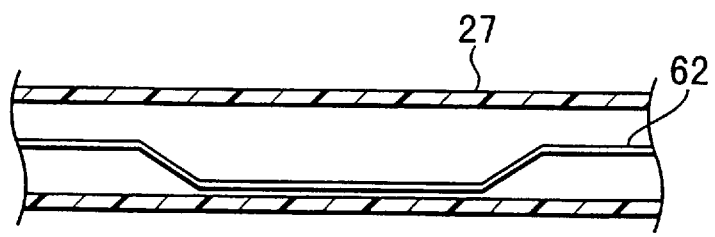
FIG. 30B is a diagram showing another modification of the third embodiment, in which the internal linear antenna inserted in the quartz pipe has its middle part bent and bulging toward the workpiece.

Furthermore, in the arrangements shown in FIGS. 30A, 30B, the internal linear antenna 62 is arranged to be bent in the interior of the quartz pipe 27 with a constant thickness. By controlling the bending shape of the internal linear antenna 62 in the interior of the quartz pipe 27, it is possible to control the density of the plasma in the interior of the plasma chamber 61. The shapes of the internal linear antennas 62 shown in FIGS. 30A, 30B are typical shapes and various other shapes can be used according to how the density of the plasma is desired to be formed. For example, as shown in FIG. 30B, if the internal linear antenna 62 is deformed toward the workpiece 6 side at the central portion in the interior of the plasma chamber 61, the density of the plasma can be raised on the workpiece 6 side of the part which has been deformed toward the internal linear antenna 62.

As mentioned above, a first to third embodiments of the present invention have been described. However, in the present invention, various modifications can be made. For example, by arranging the internal linear antennas 62 in the shape of parallel crosses, more efficient and uniform creation of plasma can be performed.

Furthermore, in the above description, the high frequency processing apparatus of etching (aching), CVD, or the like, using high frequency discharge has been mentioned, however, it is also possible to provide a high frequency discharging apparatus which is the source for creating a plasmatic state in a container or the like.

Furthermore, various modifications can be made within the scope and spirit of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A plasma processing method comprising the steps of:
providing a linear antenna in a container, said linear antenna including copper or aluminum and having an insulating covering on a periphery thereof;
introducing a plasma generating gas into the container;
supplying high-frequency power to the linear antenna to generate an induction field and turn the plasma generating gas into plasma;
processing of an object arranged inside the container with said generated plasma; and
controlling electrostatic coupling between the linear antenna and the plasma including setting a Redetermined point on the linear antenna to 0V.

2. The plasma processing method according to claim 1, wherein the linear antenna comprises a plurality of identical antennas that are connected in series.

3. The plasma processing method according to claim 1, wherein the linear antenna, comprises a plurality of antennas that are connected in parallel.

4. A plasma processing method comprising the steps of:
providing a linear antenna in a container, said linear antenna including copper or aluminum and having no insulating covering on a periphery thereof;
introducing a plasma generating gas into the container;
supplying high-frequency power to the linear antenna to generate an induction field and turn the plasma generating gas into plasma;
processing an object arranged inside the container with said generated plasma; and
controlling electrostatic coupling between the linear antenna and the plasma including setting a predetermined point on the linear antenna to 0V.

5. The plasma processing method according to claim 4, wherein the linear antenna comprises a plurality of antennas that are connected in series.

6. The plasma processing method according to claim 4, wherein the linear antenna comprises a plurality of antennas that are connected in parallel.

* * * * *